United States Patent
Gao et al.

(10) Patent No.: US 7,439,599 B2
(45) Date of Patent: Oct. 21, 2008

(54) PIN PHOTODIODE STRUCTURE AND FABRICATION PROCESS FOR REDUCING DIELECTRIC DELAMINATION

(75) Inventors: Xiang Gao, Edison, NJ (US); Alex Ceruzzi, Princeton Junction, NJ (US); Steve Schwed, Bridgewater, NJ (US); Linlin Liu, Hillsborough, NJ (US); Mark Gottfried, Hillsborough, NJ (US)

(73) Assignee: Emcore Corporation, Albuquerque, NM (US)

( * ) Notice: Subject to any disclaimer, the term of this patent is extended or adjusted under 35 U.S.C. 154(b) by 234 days.

(21) Appl. No.: 11/079,708

(22) Filed: Mar. 14, 2005

(65) Prior Publication Data

US 2006/0076589 A1    Apr. 13, 2006

Related U.S. Application Data

(60) Provisional application No. 60/613,099, filed on Sep. 27, 2004.

(51) Int. Cl.
*H01L 31/00* (2006.01)
(52) U.S. Cl. ............... 257/443; 257/458; 257/466
(58) Field of Classification Search ............. 257/443, 257/458, 466
See application file for complete search history.

(56) References Cited

U.S. PATENT DOCUMENTS 6,774,448 B1 *   8/2004   Lindemann et al. ......... 257/443
2004/0169287 A1 *   9/2004   Honda ......................... 257/778

* cited by examiner

*Primary Examiner*—Long Pham (57) ABSTRACT

A PIN photodiode, and a method of manufacturing a PIN photodiode that reduces dielectric delamination and increases device reliability. The process proceeds by forming an first type electrode layer on the substrate; forming an intrinsic layer of the first type electrode layer; forming a second type electrode layer on the intrinsic layer; etching the second type electrode layer to define a mesa shaped structure; and depositing a passivation material over the mesa shaped structure.

8 Claims, 12 Drawing Sheets

90 DEGREE CROSS SECTION FOR VERTICAL DIODE DESIGN WITHOUT DELAMINATION STOPPER

FIG.5B

PIN PHOTODIODE STRUCTURE AND FABRICATION PROCESS FOR REDUCING DIELECTRIC DELAMINATION

BACKGROUND OF THE INVENTION

1. Field of the Invention

The invention relates generally to PIN photodiodes. More particularly, the invention relates to a PIN photodiode semiconductor structure diodes used in high temperature, high humidity environments, and processes for fabrication of such devices.

2. Description of the Related Art

Fiber optic communications typically employ a modulated light source, such as a laser, a photodiode light detector, and an optical fiber interconnecting the laser and the photodiode. The laser is modulated to emit light pulses that are transmitted over an optical fiber and received at a remote unit that includes a photodiode to convert the optical signal into an electrical signal. In particular PIN diodes are widely used as the photodiodes in the optical receiver for high speed fiber optics communication. Traditionally package for these devices involve in hermetic seal in order for them to survive the high temperature, high humidity environment (HTHH). The requirement of hermetic sealing leads to complication of the device design and often results in a relatively high cost of the final product. The requirement hermetic sealing sometime can also limit the operational performance of the device, and not permit it to operate at its optimal speed.

It is highly desirable to assemble the optical receiver without hermetic sealing, which in turn requires the discrete PIN device o be able to survive under harsh operating conditions such as a temperature of 85 degrees Centigrade and 85% humidity level for more than 1000 hours. The use of a dielectric layer deposited on the top of the active region of the device substantially reduces the surface recombination related operating dark, and can increase the device lifetime as well. However, the separation or delamination of the dielectric layer away from the active region dielectric often occurs under HTHH with reverse biased operating conditions. In case the delamination bridges both anode and cathode, the dielectric passivation is broken, leading to the failure of the device.

Prior to the present invention, there has not been suitable means for prevention of delamination of the dielectric sealing layer in a PIN photodiode.

SUMMARY OF THE INVENTION

1. Objects of the Invention

It is an object of the present to provide an improved semiconductor device structure for a PIN photodiode.

It is another object of the present invention to provide an improved hermetically sealed PIN photodiode.

It is also another object of the present invention to provide a delamination stopper for PIN photodiodes.

It is also an object of the present invention to provide a process to provide a delamination stopper for a PIN photodiode and thereby provide consistent fabrication and reliability of such devices.

2. Features of the Invention

Briefly, and in general terms, the present invention provides a method of manufacturing a PIN photodiode that reduces dielectric delamination by forming an first type electrode layer on a substrate; forming an intrinsic later on the first type electrode layer; forming a second type electrode layer on the intrinsic layer; etching the second type electrode layer to define a mesa shaped structure; and depositing a passivation material over the mesa shaped structure.

The present invention also provides a PIN photodiode with a first type electrode layer disposed on a substrate; an intrinsic layer, including a first lower region having a first length, and a second upper region having a second length, smaller than the first length, disposed over a portion of the first-type cathode layer, and a second type electrode layer disposed over at least a portion of the intrinsic layer so as to form a mesa shaped structure. A passivation or dielectric layer is disposed over the mesa shaped structure to provide hermetic sealing.

Another aspect of the present invention is to provide a method of manufacturing a PIN photodiode by depositing a first type electrode layer on a substrate; depositing an intrinsic layer on the first type electrode layer; depositing a second type electrode layer on the intrinsic layer; etching a trench through the second type electrode layer, the intrinsic layer, the first type electrode layer, to define an enclosed region; and depositing a passivation material in the trench.

The reduction in dielectric delamination in the PIN diode as a result of this fabrication process is a substantial improvement of the PIN diode lifetime, particularly under 85 degrees Centigrade and 85% humidity conditions. The use of such hermetically sealed photodiodes in an optical receiver allow such units to operate under industrial standards for high temperature, high humidity environments.

The objects, features, and advantages of this invention will become apparent upon reading the following specification, when taken in conjunction with the accompanying drawings. It is intended that all such additional features and advantages be included therein with the scope of the present invention, as defined by the claims.

The invention can be better understood with reference to the following drawings. The components in the drawings are not necessarily to scale, emphasis instead being placed upon clearly illustrating the principles of the present invention. In the drawings, like reference numerals designate corresponding parts throughout the several views.

FIG. 1c is a top plan view of the lateral PIN photodiode of FIG. 1a;

FIG. 2b is another cross-sectional view of the lateral PIN photodiode of FIG. 2a;

FIG. 2c is a top plan view of the lateral PIN photodiode of FIG. 2a;

FIG. 5b is a top plan view of the vertical PIN photodiode of FIG. 5a.

The novel features which are considered as characteristics of the invention are set forth in particular in the appended claims. The invention itself, however, both as to its construction and its method of operation, together with additional objects and advantages thereof, best will be understood from the following description of specific embodiments when read in connection with the accompanying drawings.

DESCRIPTION OF THE PREFERRED EMBODIMENT

Details of the present invention will now be described, including exemplary aspects and embodiments thereof. Referring to the drawings and the following description, like reference numbers are used to identify like or functionally similar elements, and are intended to illustrate major features of exemplary embodiments in a highly simplified diagrammatic manner. Moreover, the drawings are not intended to depict every feature of actual embodiments nor the relative dimensions of the depicted elements, and are not drawn to scale.

Figure 1A:
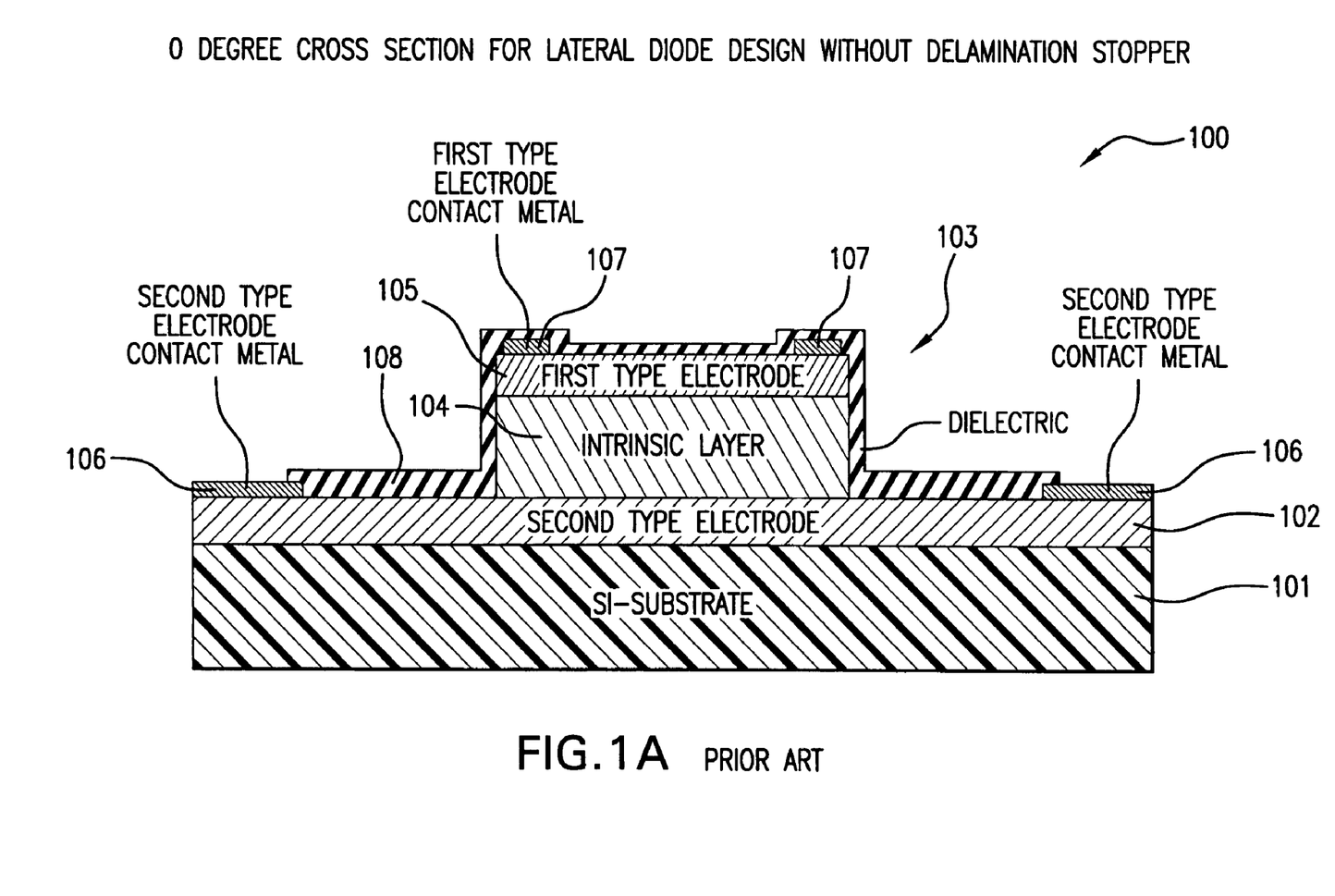
FIG. 1A is a cross-sectional view of the lateral PIN photodiode constructed in accordance with the prior art.
Figure 1B:
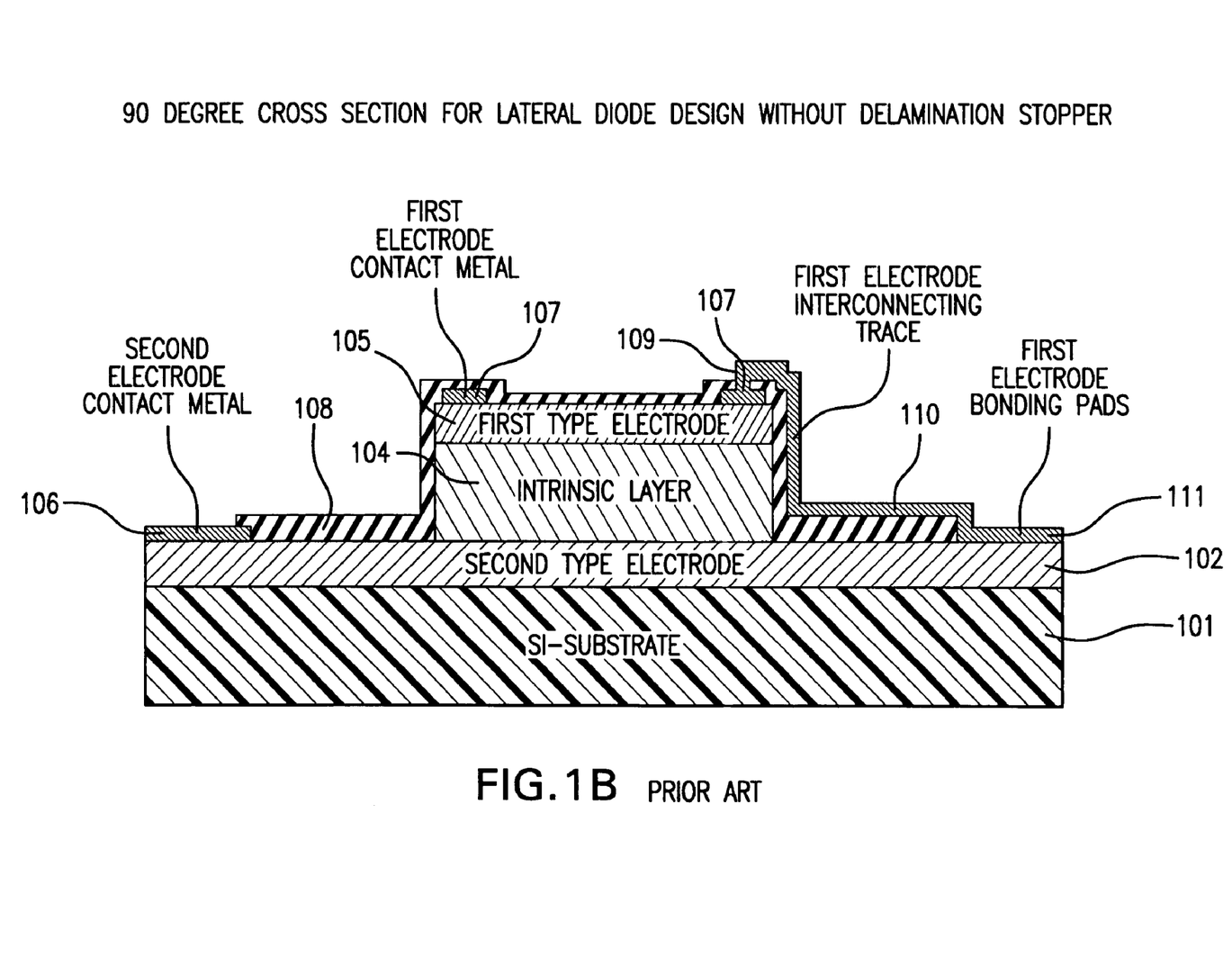
FIG. 1b is another cross-sectional view of the lateral PIN photodiode of FIG. 1A.
Figure 1C:
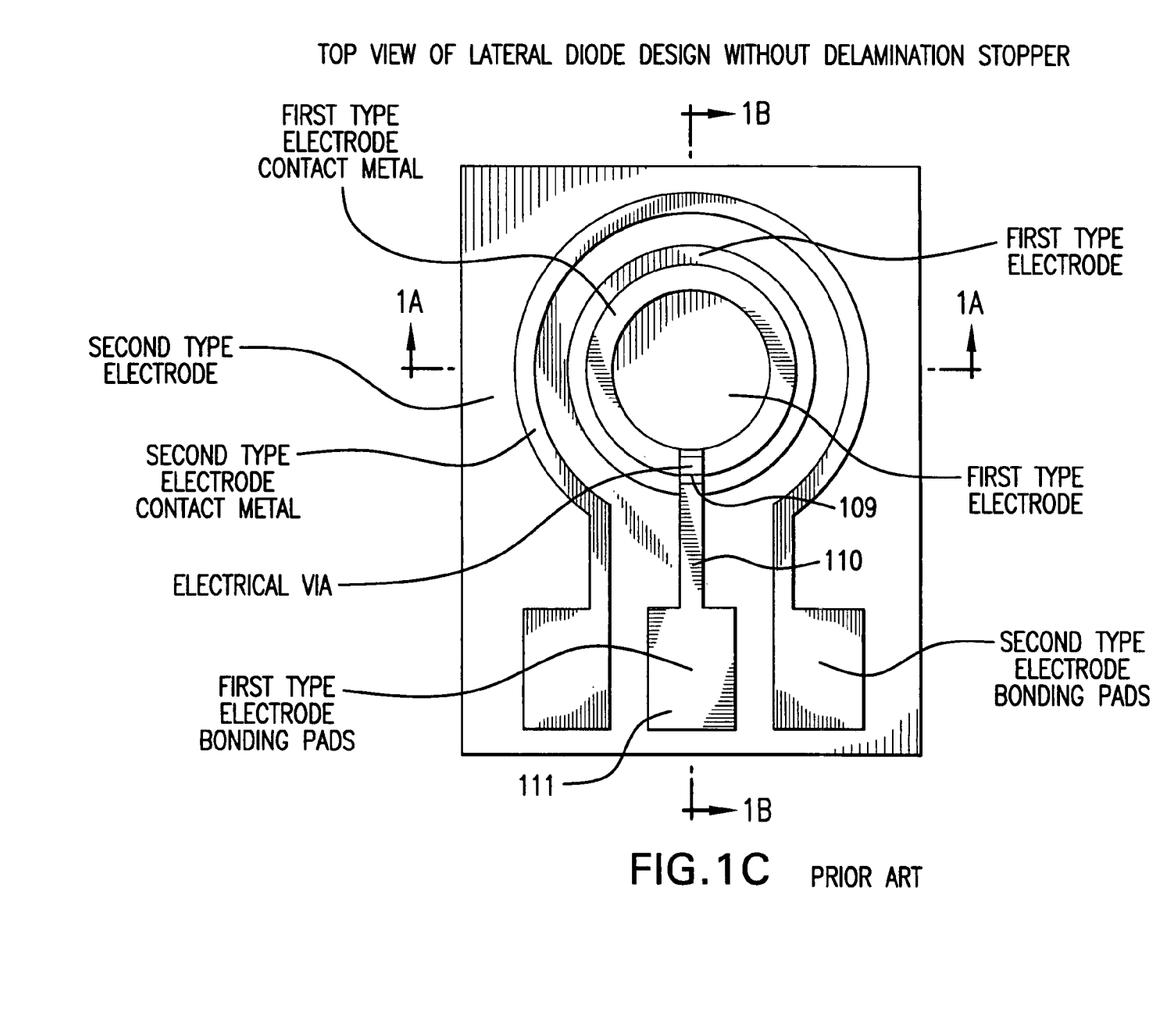

FIGS. 1a, 1b and 1c depict a lateral PIN diode as known in the prior art.

Referring to FIG. 1a, there is shown a fragmentary, cross-sectional view of a semiconductor structure representing a lateral PIN photodiode which is depicted with generic first and second type electrodes. In particular, the photodiode 100 includes a semi-insulating (SI) substrate 101, and an n-type cathode layer 102 disposed on the substrate. A mesa 103 consisting of an intrinsic layer 104 is disposed on a portion of the layer 102, and a p-type anode layer 105 is disposed on the intrinsic layer 104. The n and p regions 102 and 105 normally are doped to high carrier concentrations while the intrinsic region 104 typically has a small, residual n or p type carrier concentration.

A metal contact 106 is made to the second type electrode, and a second metal contact 107 is made to the first type electrode. A dielectric layer 108 is deposited over the active regions of the device for hermetic sealing.

FIG. 1b is another cross-sectional view of the lateral PIN photodiode of FIG. 1a as viewed from a plane ninety degrees from that of FIG. 1a. Such a view shows a via 109 in the dielectric layer 108 where the contact 107 makes electrical connection to an interconnecting trace 110 which extends over the dielectric layer 108 to first electrode bonding pads 111.

FIG. 1c is a top plan view of the lateral PIN photodiode of FIG. 1a depicting the planes 1A-1A and 1B-1B from which the cross-sectional views of FIGS. 1a and 1b respectively are derived.

PIN photodiodes such as that shown in FIGS. 1a, 1b and 1c are negatively biased such that the entire intrinsic region 104 is depleted and substantially no current flows through the intrinsic region 104.

Figure 2A:
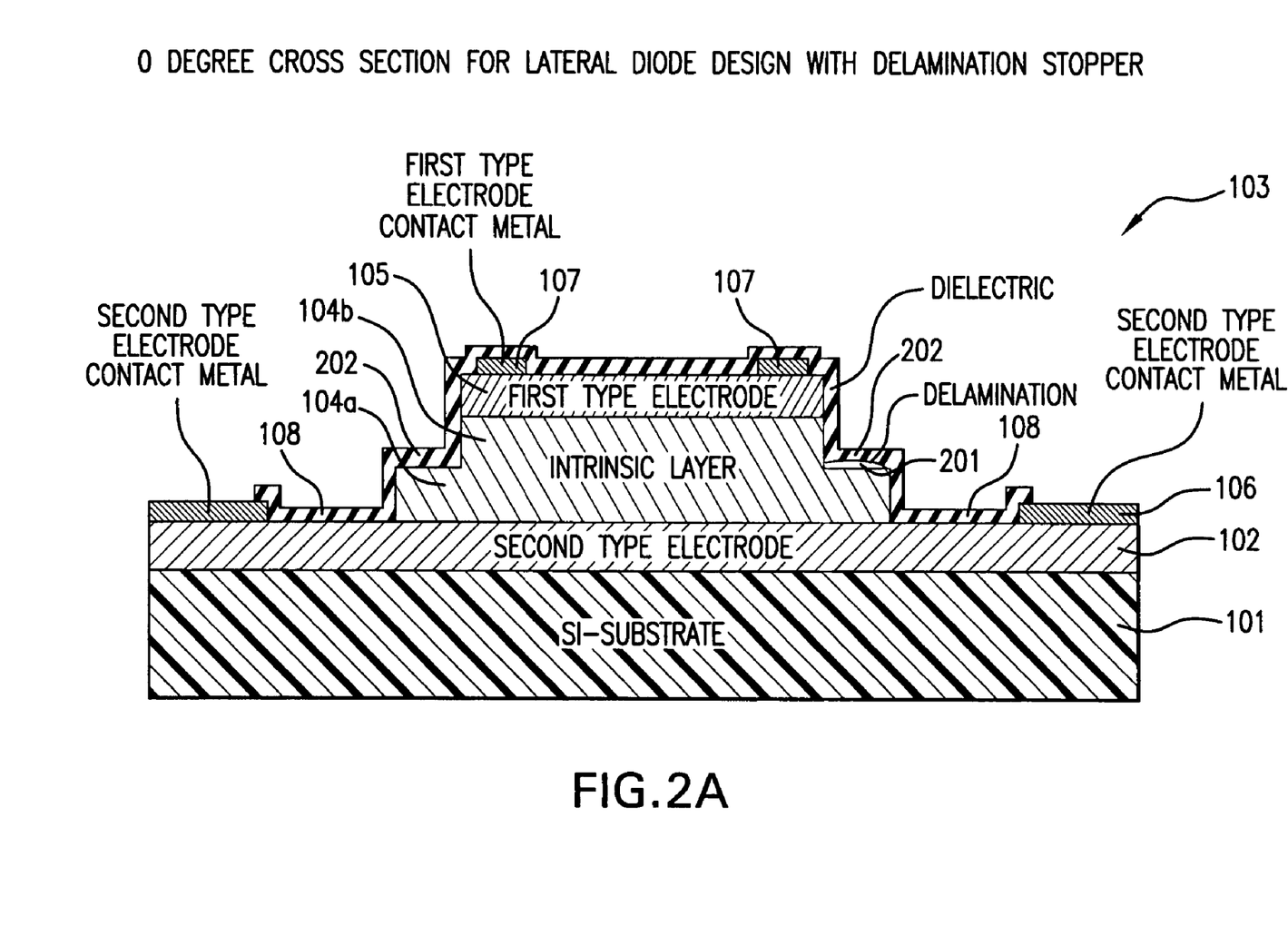
FIG. 2a is a cross-sectional view of a lateral PIN photodiode constructed in accordance with the present invention.
Figure 2B:
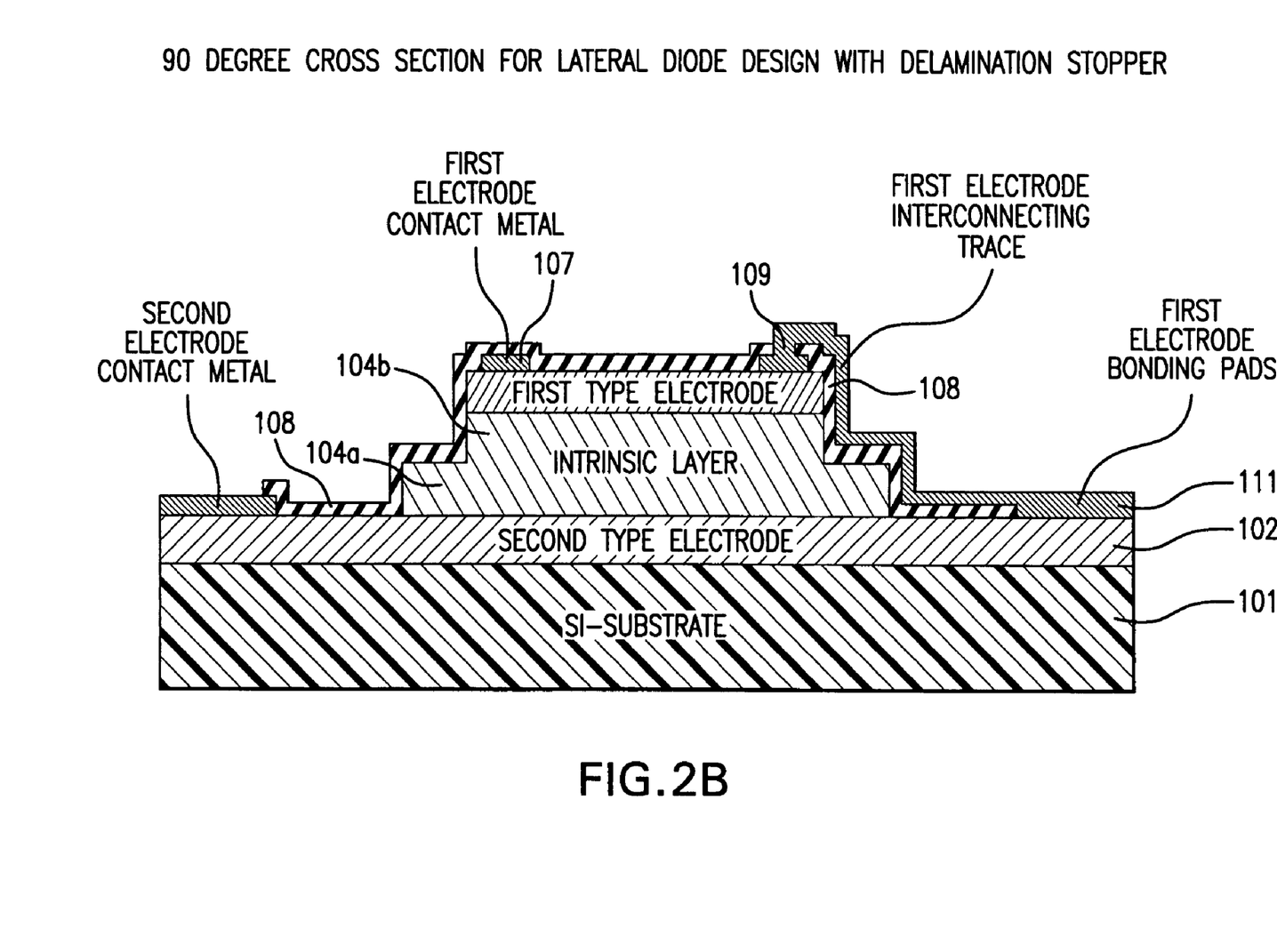
Figure 2C:
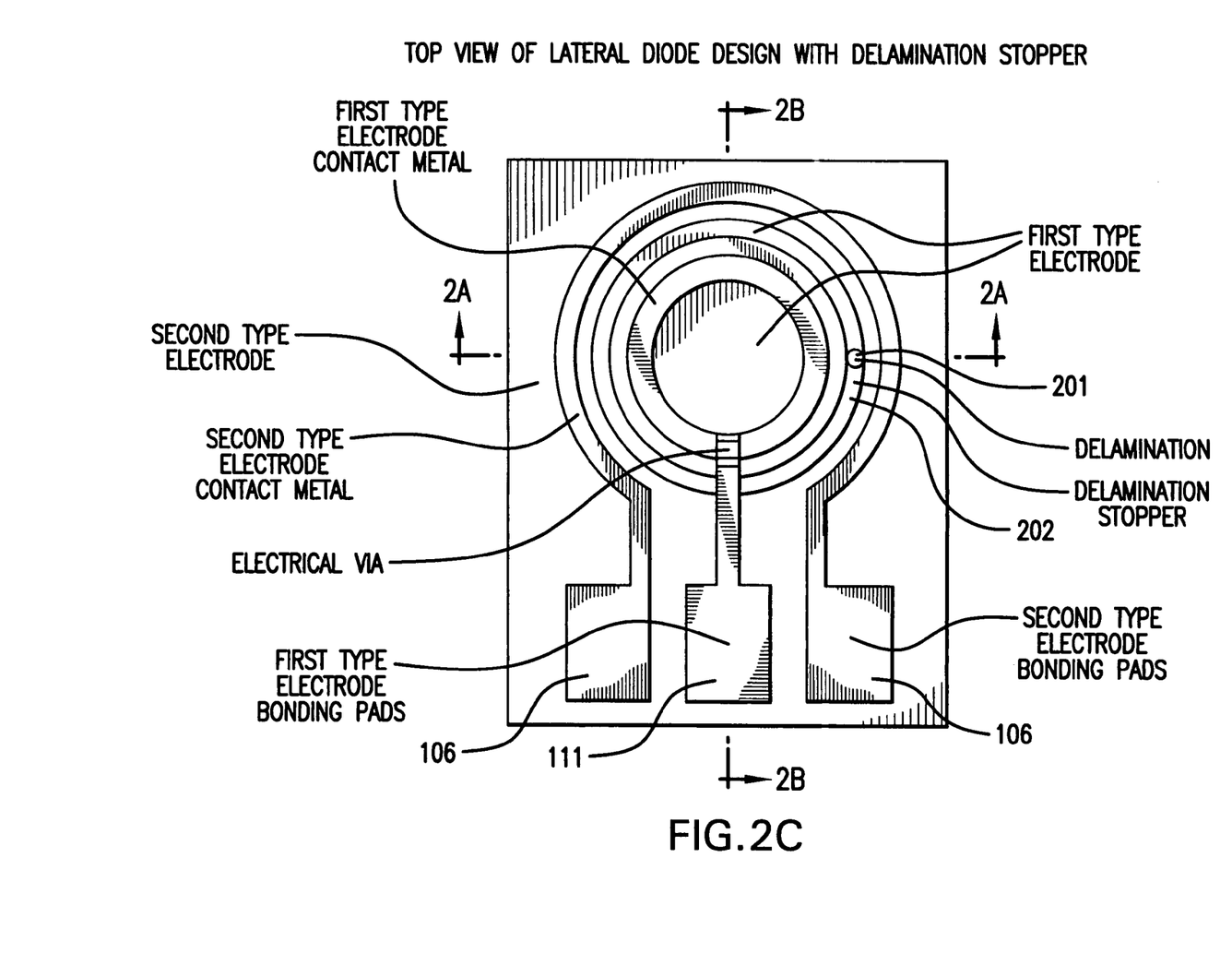

FIGS. 2a, 2b and 2c depict a lateral PIN diode with a delamination stopper structure according to the present invention.

Referring to FIG. 2a, there is shown a fragmentary, cross-sectional view of a semiconductor structure representing a lateral PIN photodiode including first and second type electrodes. In particular, the photodiode 100 includes a semi-insulating (SI) substrate 101, and an n-type cathode layer 102 disposed on the substrate. A mesa 103 consisting of a stepped intrinsic layer 104a and 104b is disposed on a portion of the layer 102, and a p-type anode layer 105 is disposed over the upper intrinsic layer 104b. The n and p regions 102 and 105 normally are doped to high carrier concentrations while the intrinsic region 104 typically has a small, residual n or p type carrier concentration.

A metal contact 106 is made to the second type electrode, and a metal contact 107 is made to the first type electrode. A dielectric layer 108 is deposited over the active regions of the device, and in particular over the ledge formed by regions 104a and 104b.

The horizontal dielectric layer portion 202 prevents the separation or delamination of the layer 108 from the active regions. As an illustration, a small gap or delamination 201 is depicted on the portion of the dielectric layer 202, which is prevented ??.

FIG. 2b is another cross-sectional view of the lateral PIN photodiode as viewed from a plane ninety degrees from that of FIG. 2a. Such view shows a via 109 in the dielectric layer 108 where the contact 107 makes electrical connection to an interconnecting trace 110 which extends over the dielectric layer 108 to first electrode bonding pad 111.

FIG. 2c is a top plan view of the lateral PIN photodiode of FIG. 2a depicting the planes 2A-2A and 2B-2B from which the cross sectional views of FIGS. 2a and 2b are derived. More particularly, the figure depicts the annular delamination stopper region 202 that lies over the intrinsic layer 104a, showing the delamination 201 being confined in extent.

Referring next to FIGS. 3a through 3i, there is shown a progressive sequence of fragmentary, cross-sectional views of a semiconductor structure during the fabrication of a lateral PIN photodiode structure.

Figure 3A:
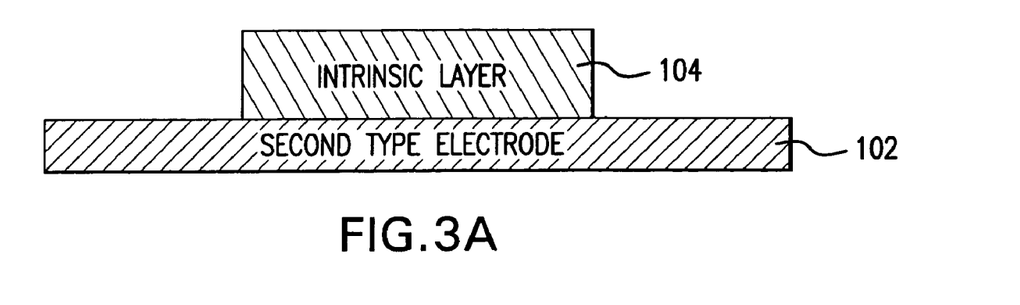
FIG. 3a is a cross-sectional view of a lateral PIN photodiode during the first fabrication step in accordance with the present invention.
Figure 3B:
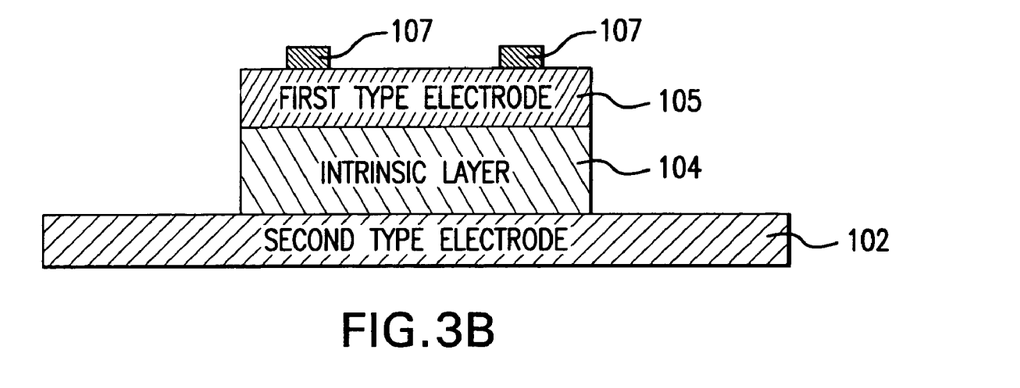
FIG. 3b is a cross-sectional view of a lateral PIN photodiode during a subsequent fabrication step in accordance with the present invention.
Figure 3C:
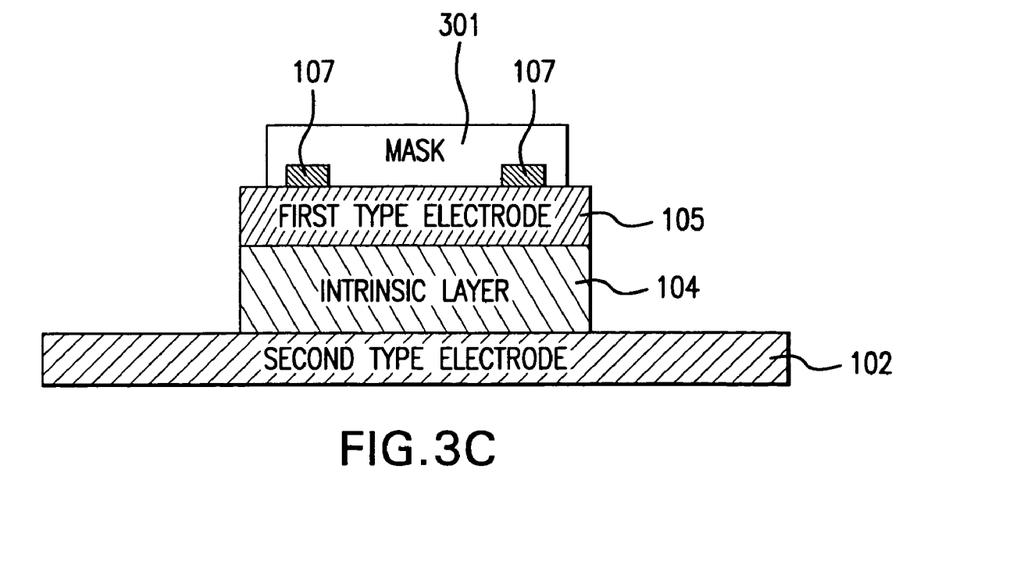
FIG. 3c is a cross-sectional view of a lateral PIN photodiode during a subsequent fabrication step in accordance with the present invention.
Figure 3D:
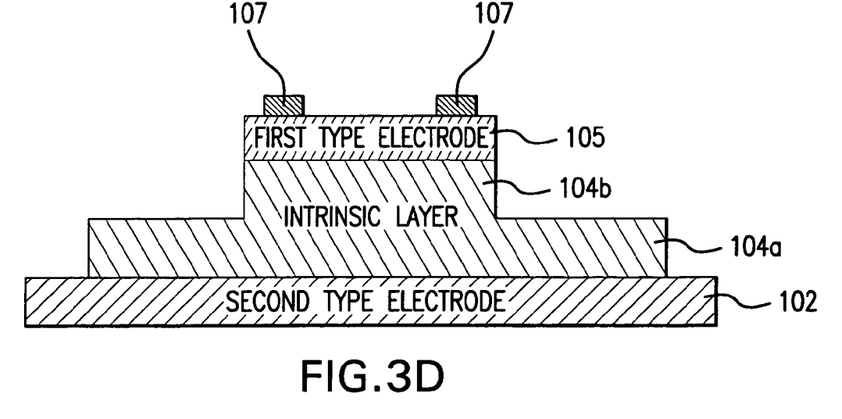
FIG. 3d is a cross-sectional view of a lateral PIN photodiode during a subsequent fabrication step in accordance with the present invention.
Figure 3E:
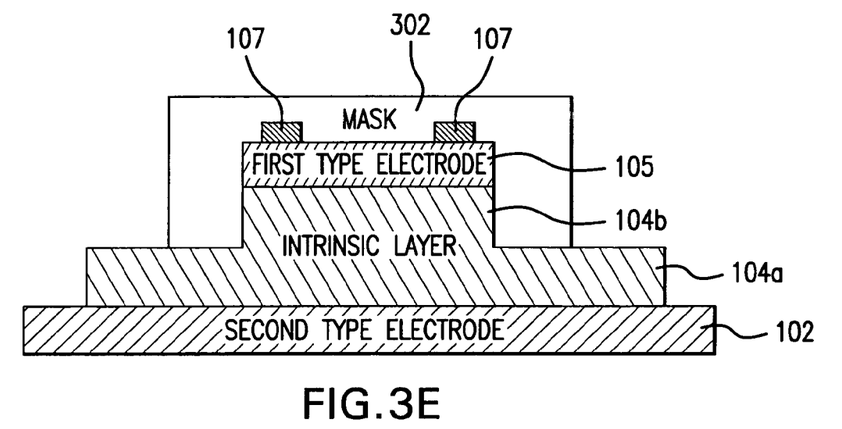
FIG. 3e is a cross-sectional view of a lateral PIN photodiode during a subsequent fabrication step in accordance with the present invention.
Figure 3F:
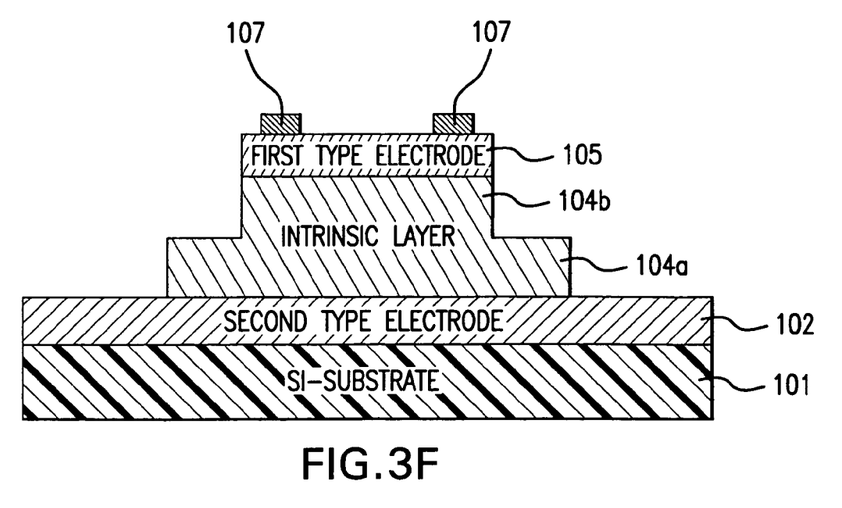
FIG. 3f is a cross-sectional view of a lateral PIN photodiode during a subsequent fabrication step in accordance with the present invention.

FIG. 3f is a cross-sectional view of the lateral PIN photodiode during a subsequent fabrication step in accordance with the present invention in which an annular portion of the lower region 104a has been etched away using the mask layer 302. The semi-insulating substrate 101 is now shown in this and subsequent figures.

Figure 3G:
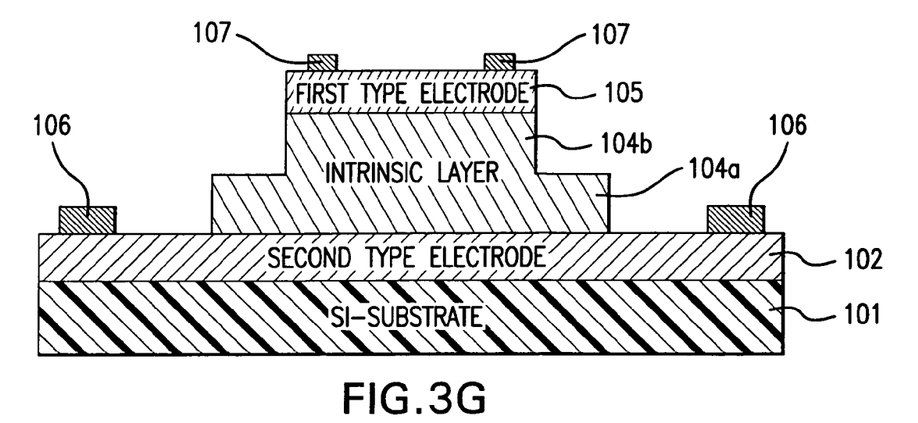
FIG. 3g is a cross-sectional view of a lateral PIN photodiode during a subsequent fabrication step in accordance with the present invention.

FIG. 3g is a cross-sectional view of the lateral PIN photodiode during a subsequent fabrication step in accordance with the present invention after the deposition of the annular electrode 106 which contacts the second type electrode 102.

Figure 3H:
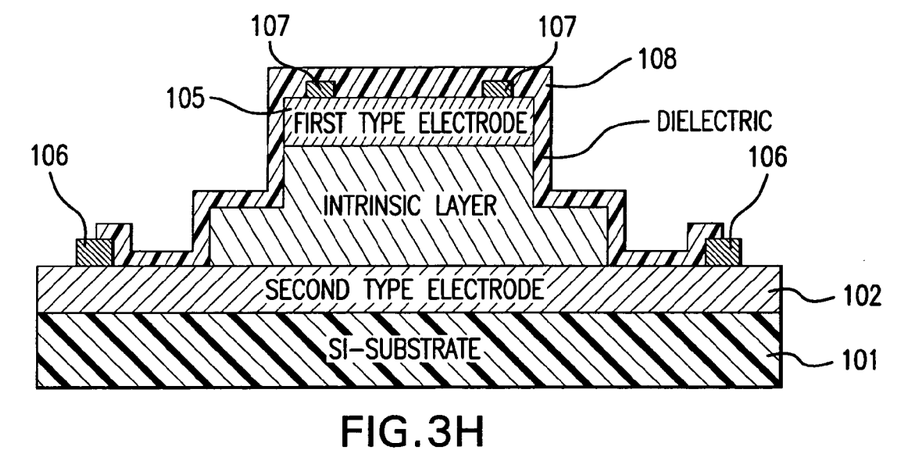
FIG. 3h is a cross-sectional view of a lateral PIN photodiode during a subsequent fabrication step in accordance with the present invention.

FIG. 3h is a cross-sectional view of the lateral PIN photodiode during a subsequent fabrication step in accordance with the present invention after deposition of a dielectric layer 108 over the entire structure.

Figure 3I:
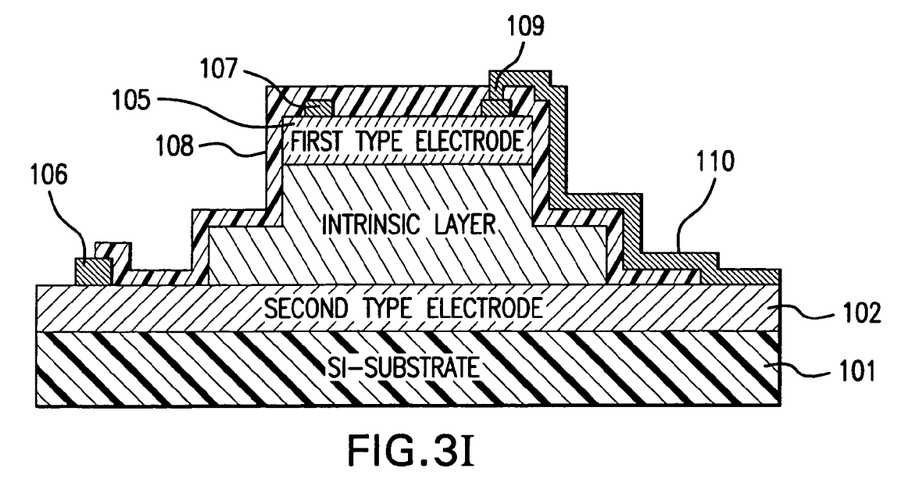
FIG. 3i is a cross-sectional view of a lateral PIN photodiode during a subsequent fabrication step in accordance with the present invention.

FIG. 3i is a cross-sectional view of the lateral PIN photodiode after etching a via 109 in the dielectric layer 108 and deposition of a metal contact layer 110 to make electrical contact with the annual contact metal layer 107. The view of FIG. 3i corresponds to that of FIG. 2b above.

Figure 4:
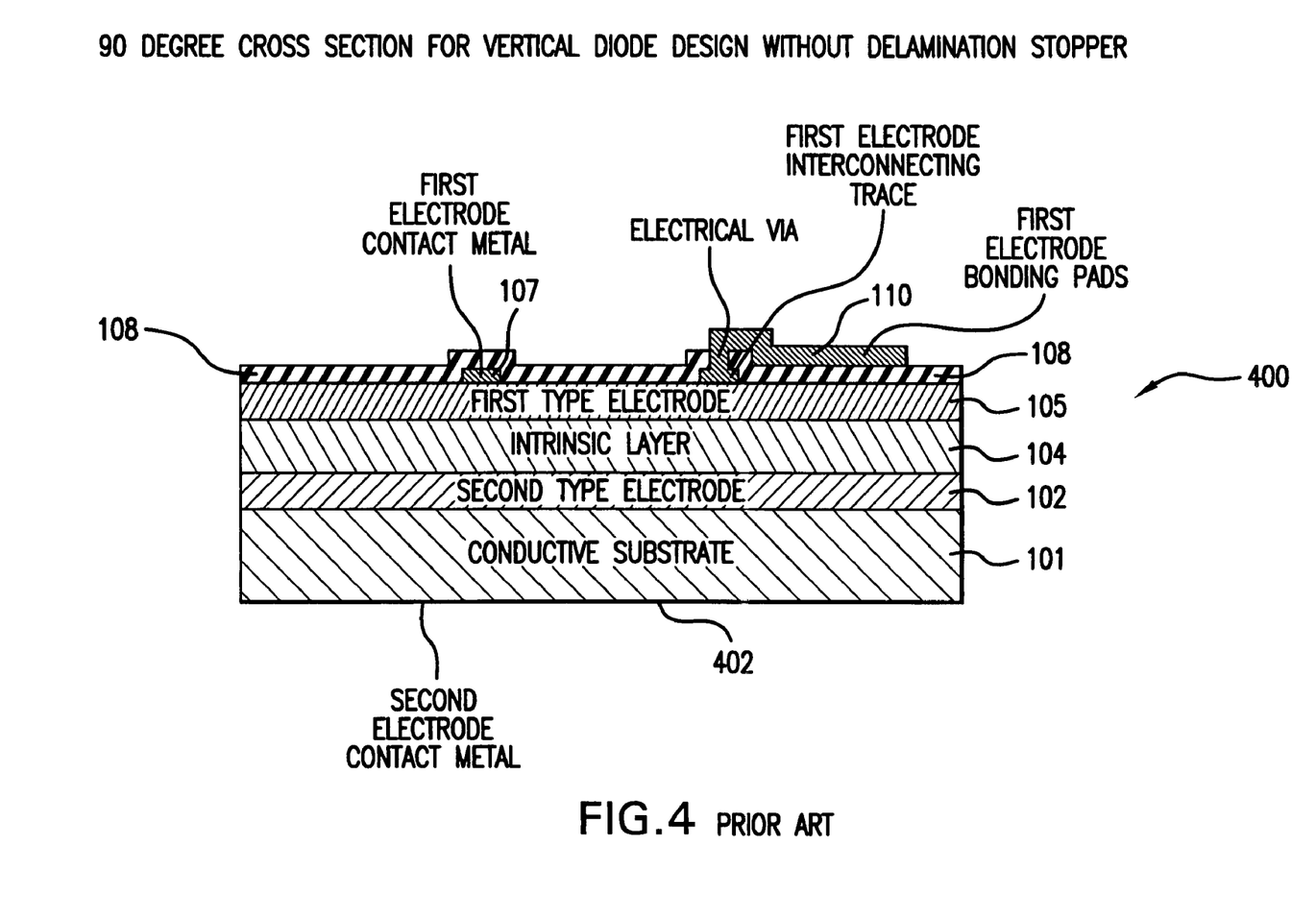
FIG. 4 is a cross-sectional view of a vertical PIN photodiode constructed in accordance with the prior art.

FIG. 4 is a cross-sectional view of a vertical PIN photodiode 400 constructed in accordance with the prior art. The electrical characteristics of the device are similar to that of the device of FIG. 1 in which the semi-insulating substrate 101 has been replaced by a conductive substrate 401, and the second electrode contact metal is no longer required to be applied to the surface of the second electrode layer; but is applied to the bottom surface 402 of the substrate 401.

Figure 5A:
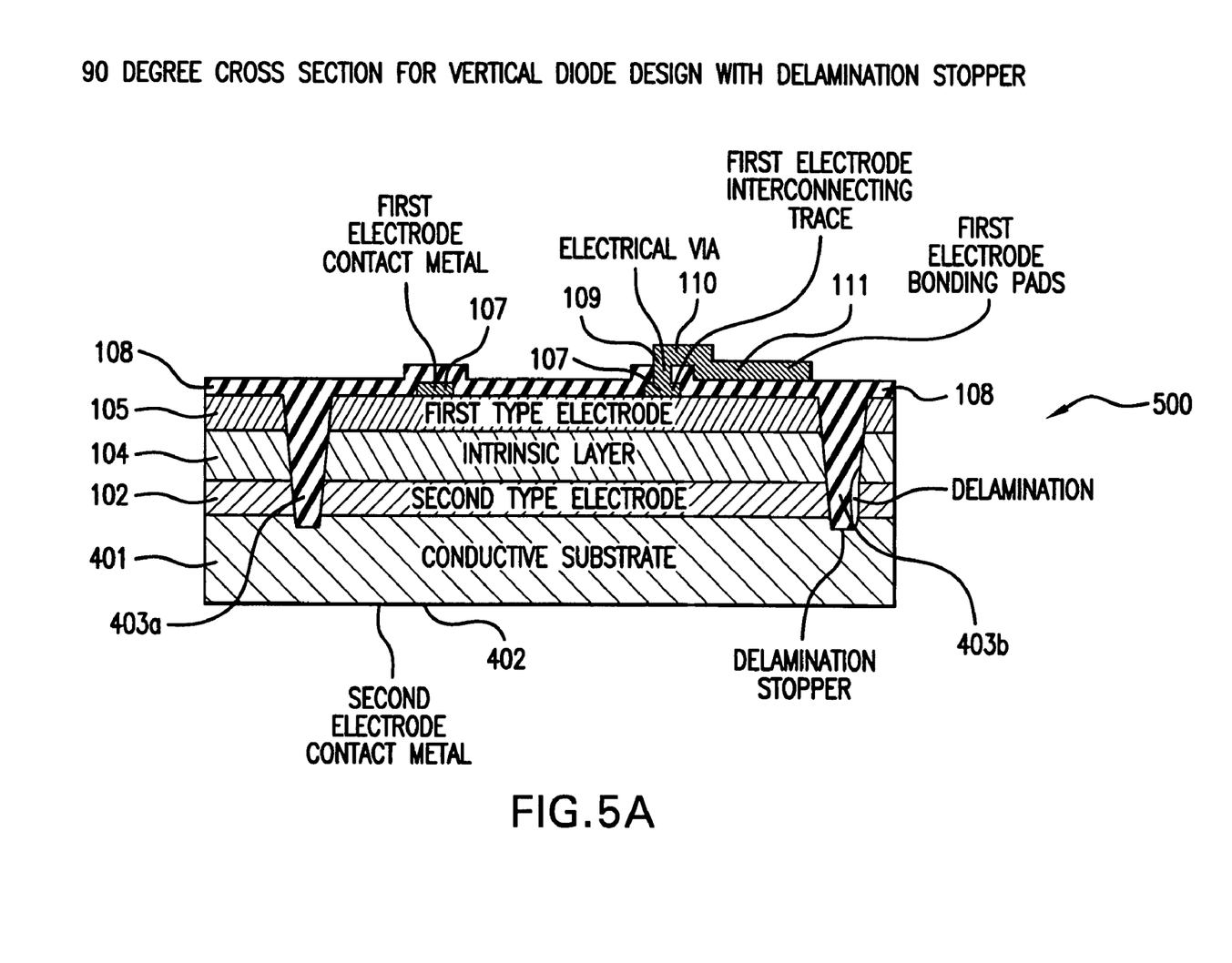
FIG. 5a is a cross-sectional view of a vertical PIN photodiode constructed in accordance with the present invention.

FIG. 5a shows a fragmentary, cross-sectional view of a semiconductor structure of a vertical PIN photodiode structure according to the present invention. In particular, the photodiode 500 includes a $n^+$ conductive substrate 401, an n-contact metal 402 deposited on the lower surface of the substrate 401 for forming a first contact, and an n-type epitaxial layer 102 deposited on the upper surface of the substrate 401. An intrinsic layer 104 is then deposited on the surface of the layer 102, and a p-type anode layer 105 is deposited on the upper surface of the intrinsic layer 104. An annular p-metal contact 107 is provided on a portion of the upper surface of the p-type anode layer 405 to make electrical contact therewith using known lithography and etching techniques. A trench 403a extending at least partially into the substrate 401 is then etched around the periphery of the PIN photodiode, as more particularly shown in the top view of FIG. 5b. A dielectric layer 108 is deposited over the active regions and into the trench 403a. A via 109 is etched in the dielectric where contact 107 makes electrical connection to an interconnecting trace 110 to first electrode bonding pads 111.

Figure 5B:
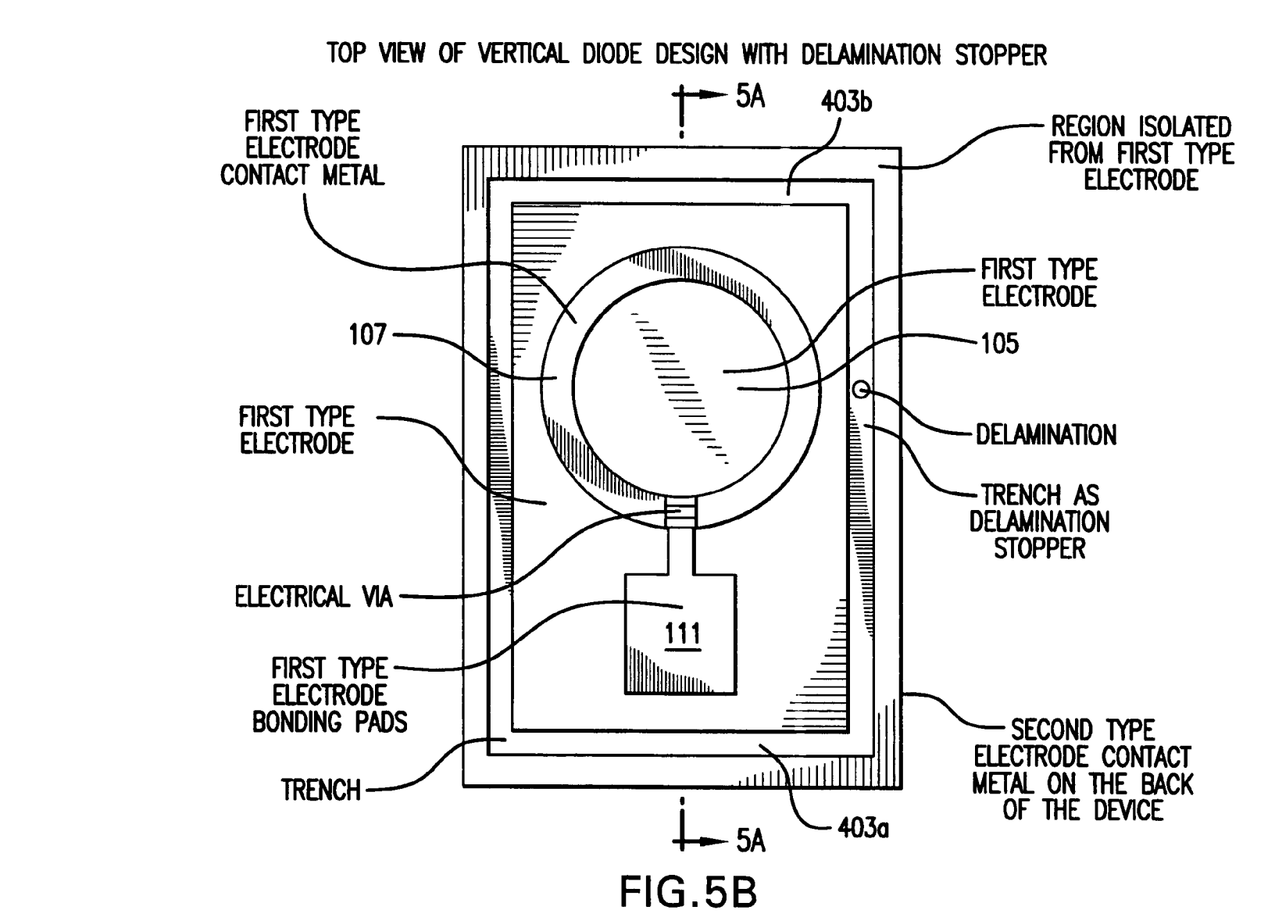

FIG. 5b is a top plan view of the vertical PIN photodiode of FIG. 5a, depicting the plane 5A-5A from which the cross-sectional view of FIG. 5a is derived.

It will be understood that each of the elements described above, or two or more together, also may find a useful application in other types of constructions differing from the types described above.

While the invention has been illustrated and described as embodied in a device and method for making PIN photodiode with a delamination stopper, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention and, therefore, such adaptations should and are intended to be comprehended within the meaning and range of equivalence of the following claims.

What is claimed is:

1. A PIN photodiode comprising:
   a substrate;
   a first type electrode layer disposed on the substrate;
   an intrinsic layer, including a first lower region having a first length, and a second upper region having a second length, smaller than the first length, disposed over a portion of the first type electrode layer with a step change from the first length to the second length located at a junction between said first lower region and said second upper region;
   a second type electrode layer disposed over at least a portion of the intrinsic layer so as to form a mesa shaped structure; and
   a passivation layer disposed over the mesa shaped structure.

2. A photodiode as defined in claim 1, wherein said lower and upper regions are substantially circular in shape.

3. A photodiode as defined in claim 1, wherein said lower and upper regions are annular regions.

4. A photodiode as defined in claim 1, wherein said second type electrode layer is disposed over substantially the entire upper surface of said upper region.

5. A photodiode as defined in claim 1, further comprising a contact layer disposed over a portion of said first type electrode layer.

6. A PIN photodiode comprising:
   a semi-insulating substrate;
   an n-type electrode layer disposed on the substrate;
   an intrinsic layer, including a first lower region having a first lateral length, and a second upper region having a second lateral length, smaller than the first length, said intrinsic layer being disposed over a portion of the n-type eletrode layer with a step change from the first length to the second length located at a junction between said first lower region and said second upper region;
   a p-type electrode layer disposed over at least a portion of the intrinsic layer; and
   a passivation layer disposed over the p-type electrode layer, the intrinsic layer, and the n-type electrode layer.

7. A vertical PIN photodiode comprising:
   a substrate;
   a first type electrode layer disposed on the substrate;
   an intrinsic layer disposed on the first type electrode layer;
   a second type electrode layer disposed over the intrinsic layer;
   a trench etched through the electrode and intrinsic layers into the substrate;
   a layer of passivation material disposed over the second type electrode layer and in the trench.

8. The photodiode as defined in claim 7, wherein the passivation material is composed of polyimide.

\* \* \* \* \*